US005731553A

United States Patent [19]
Ledoux

[11] Patent Number: 5,731,553

[45] Date of Patent: Mar. 24, 1998

[54] SPEAKER SYSTEM

[75] Inventor: Patrice Ledoux, Omerville, Canada

[73] Assignee: Excel Sound & Art, Magog, Canada

[21] Appl. No.: 790,449

[22] Filed: Jan. 29, 1997

[51] Int. Cl.[6] .......... H05K 5/00

[52] U.S. Cl. .......... 181/156; 181/151; 181/199

[58] Field of Search .......... 181/145, 146, 181/148, 151, 152, 156, 160, 199; 381/156, 158, 159, 154

[56] References Cited

U.S. PATENT DOCUMENTS

| | | | |
|---|---|---|---|
| 3,978,941 | 9/1976 | Seibert | 181/156 X |
| 4,790,408 | 12/1988 | Adair | 181/152 |
| 4,837,837 | 6/1989 | Taddeo | 181/151 X |
| 4,953,655 | 9/1990 | Furukawa | 181/160 |

*Primary Examiner*—Khanh Dang
*Attorney, Agent, or Firm*—George A. Seaby

[57] ABSTRACT

Attempts to achieve fidelity of sound produced by speaker systems has led to often large, relatively complicated and expensive speaker cabinets, particularly for reproducing sound in the lower acoustic frequencies. A simple solution to the problem is a speaker assembly including a housing divided by a partition into a speaker chamber containing a speaker and a sound outlet chamber. The sound outlet chamber contains a sound outlet box remote from an opening in the partition connecting the speaker chamber to the sound outlet chamber. A sound outlet tube extends through the box and one wall of the housing. The interior of the box and at least a portion of the area around the box are filled with sand or another solid material for eliminating vibration or at least reducing vibration to a minimum.

13 Claims, 4 Drawing Sheets

SPEAKER SYSTEM

BACKGROUND OF THE INVENTION

1. Field of the Invention

This invention relates to a speaker assembly, and specifically to a speaker assembly for reproducing sound, particularly in the lower acoustic frequencies.

2. Discussion of the Prior Art

Over the years, a great deal of effort has been expended in the design and production of speaker apparatuses. Examples of such apparatuses are described in U.S. Pat. Nos. 2,097,289, which issued to H. F. Olson on Oct. 26, 1937; 2,167,625, which issued to E. P. Albano on Aug. 1, 1939; 2,475,782, which issued to G. M. Giannini on Jul. 12, 1949; 2,689,016, which issued to H. C. Lang on Sep. 14, 1954; 2,878,887, which issued to Van R. Potter on Mar. 24, 1959; 3,072,212, which issued to R. Y. Chapman on Jan. 8, 1963; 3,393,766, which issued to L. H. Mitchell on Jul 23, 1968; 4,301,889, which issued to David V. Tralonga on Nov. 24, 1981; 5,092,424, which issued to W. P. Schreiber et al on Mar. 3, 1992; 5,111,509, which issued to Akihiko Takeuchi et al on May 5, 1992; 5,189,706, which issued to Tatsuo Saeki on Feb. 23, 1993 and 5,479,520, which issued to Joris A. M. Nieuwendijk et al on Dec. 26, 1995.

Partly as a result of the above described inventions, and to meet the demands of consumers, there is large number of speaker assemblies available in the marketplace. Such assemblies include one or more speakers mounting in a single or a plurality of cabinets or housings. In general, a sound system includes two speaker assemblies for achieving stereophonic sound or simply "stereo". For the true aficionado, two speaker assemblies are not enough. In order to achieve good stereophonic sound, three and often more speakers are employed. In fact, it is not uncommon to use a plurality of speaker apparatuses which occupy a large portion of a sound or music room.

The biggest problem facing the manufacturers of such apparatuses is to provide a product which faithfully reproduces sound in the lower acoustic frequencies, i.e. so-called woofers. The problem lies not in the speaker itself, but in the cabinet or housing carrying the speaker. For a variety of reasons, including vibration and echo, faithful sound reproduction or fidelity is difficult to achieve. In spite of considerable effort and expense, there still exists a need for a speaker assembly, which accurately reproduces sound in the lower acoustic frequencies.

GENERAL DESCRIPTION OF THE INVENTION

The object of the present invention is to meet the above defined need by providing a relatively simple speaker assembly, which is easy to build, and which is capable of faithfully reproducing sound in the lower acoustic frequencies.

Accordingly, the present invention relates to a speaker assembly comprising a housing means; first partitions means dividing the interior of said housing into a speaker chamber for receiving a speaker, and a sound outlet chamber; a sound outlet box in said outlet chamber; a sound outlet tube in said outlet chamber; and solid material in said outlet box surrounding said outlet tube for preventing vibration of said tube during the passage of sound therethrough.

BRIEF DESCRIPTION OF THE DRAWINGS

The invention is described hereinafter in greater detail with reference to the accompanying drawings, which illustrate a preferred embodiment of the invention, and wherein.

DESCRIPTION OF THE PREFERRED EMBODIMENT

Figure 1:
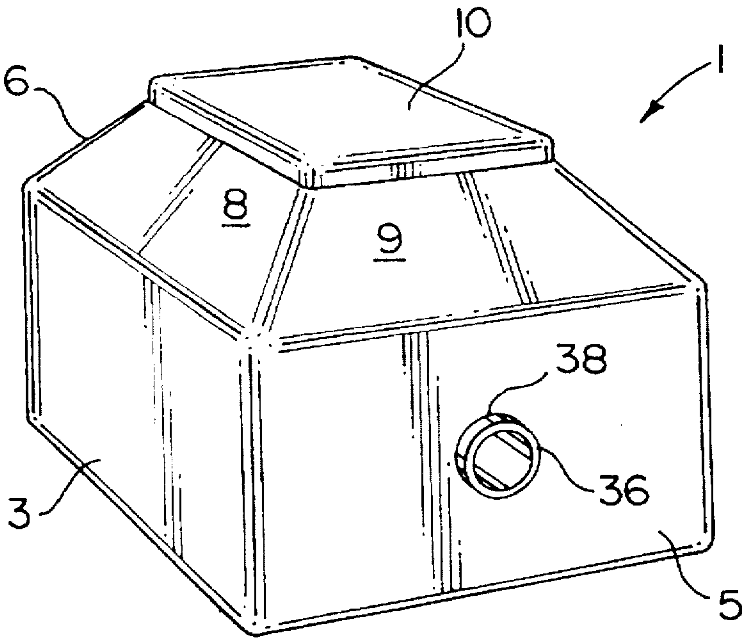
FIG. 1 is a perspective view of a speaker assembly in accordance with the present invention.
Figure 2:
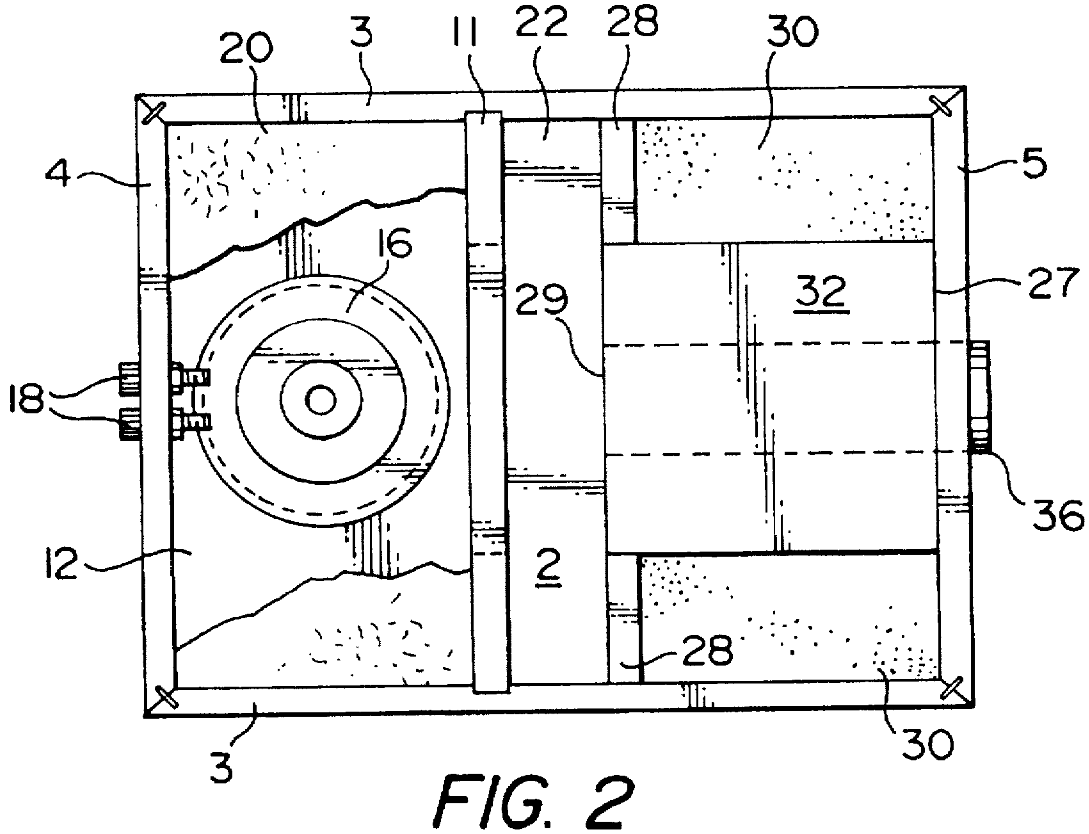
FIG. 2 is a partly sectioned, top view of the speaker assembly of FIG. 1 with the covers removed.
Figure 3:
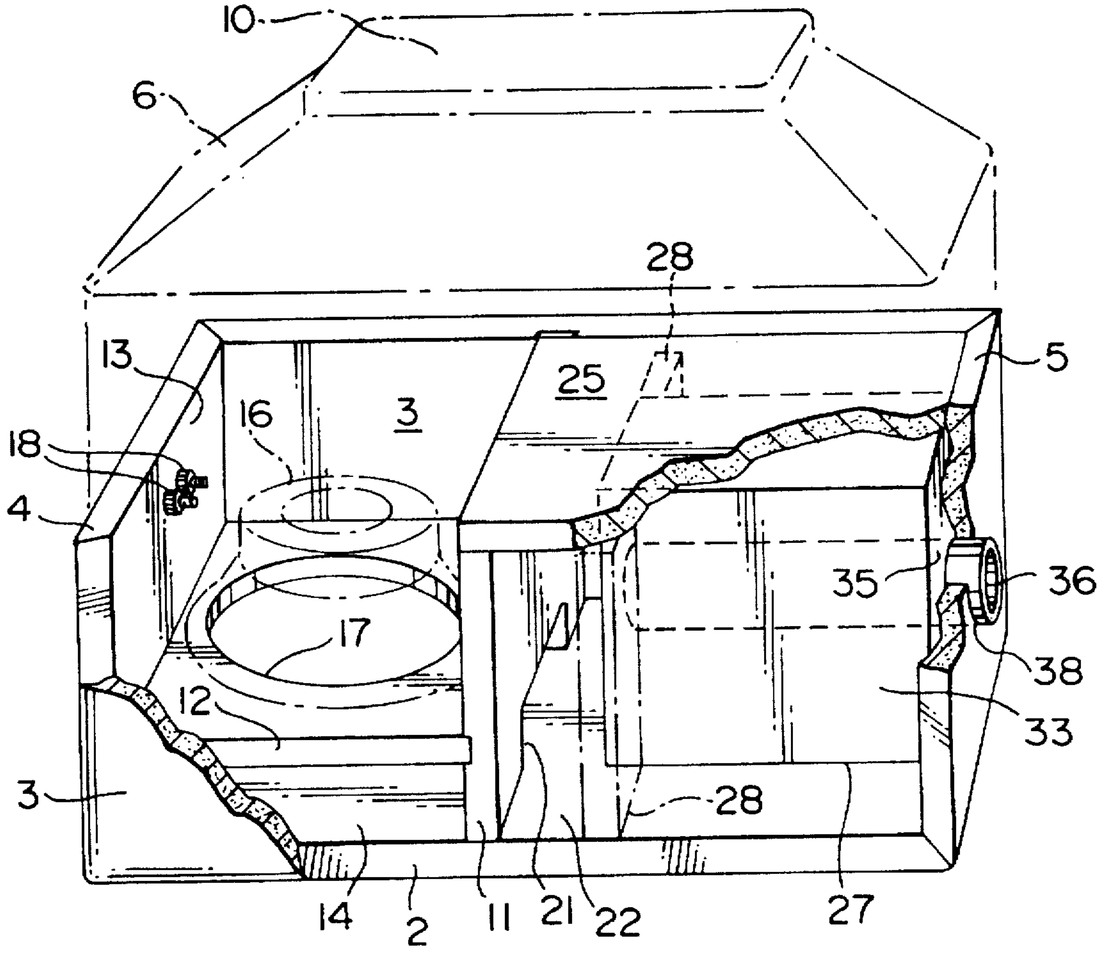
FIG. 3 is a partly sectioned, exploded, perspective view of the speaker assembly of FIGS. 1 and 2 as seen from above and one side.

Referring to FIGS. 1 to 3, a speaker assembly in accordance with the invention includes a housing generally indicated at 1. The housing is defined by a bottom wall 2, side walls 3, end walls 4 and 5, and a frustopyramidal cover 6. The cover 6 includes inclined side and end walls 8 and 9, respectively, and a rectangular top wall 10.

A vertical partition 11 extends across the housing 1 between the side walls 3. A second, horizontal partition 12 extends between the side walls 3 and between the vertical partition 11 and one end wall 4. The partitions 11 and 12 divide one end of the housing 1 into an upper, speaker chamber 13 and a lower, intermediate chamber 14. A speaker 16 is mounted on the partition 12 over a circular opening 17 in the partition 12 for admitting sound into the intermediate chamber 14. Power is fed to the speaker 16 via jacks 18 mounted in the end wall 4. A aner 20 defined by a polyester fiber batt (FIG. 2) covers the input or top end of the speaker 16 to prevent or at least to reduce echo.

Figure 6:
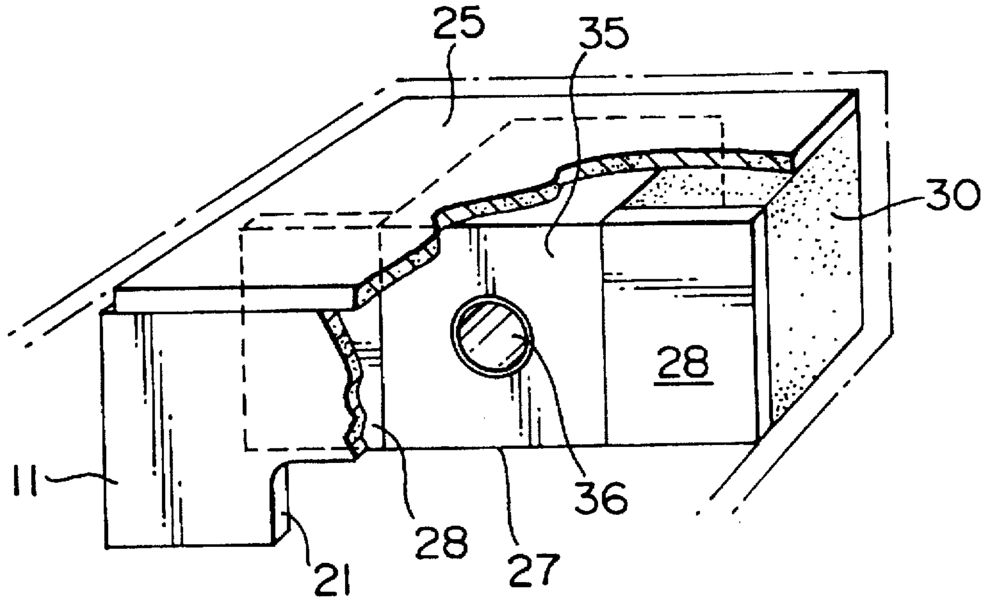
FIG. 6 is a partly sectioned perspective view of the other end of the housing of FIG. 5 and FIGS. 7 and 8 are longitudinal sectional views of a second embodiment of the speaker assembly, the two view being perpendicular to each other.

Sound from the speaker 16 travels through a gap in the form of an arch-shaped opening 21 in the bottom of the partition 11 into a sound outlet chamber 22. The outlet chamber 22 is defined by the partition 11, the side walls 3, the end wall 5 and a top plate or cover 25. As best shown in FIGS. 3 and 6, the top 25 extends between the side walls 3, and between the vertical partition 11 and the end wall 5.

An outlet box 27 is mounted in the center of one end of the outlet chamber 22 abutting the end wall 5. Spacers or vertical partitions 28 extend between the inner end 29 (FIG. 2) of the outlet box 27 and the side walls 3, and from the bottom wall 2 of the housing 1 to the top plate 25. The areas on each side of the outlet box 27 are filled with sand 30 or another solid material, which, along with the partitions 28, firmly locates the outlet box 27 in the outlet chamber 22 and prevents any vibration of the box.

Figure 4:
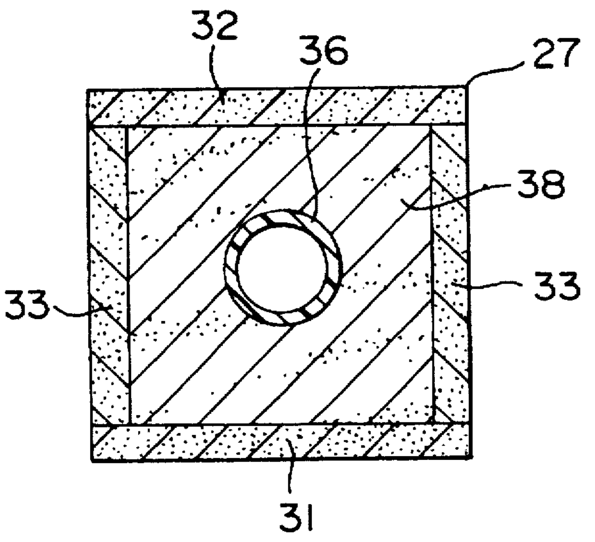
FIG. 4 is a cross-sectional view of an outlet box used in the speaker assembly of FIGS. 1 to 3.
Figure 5:
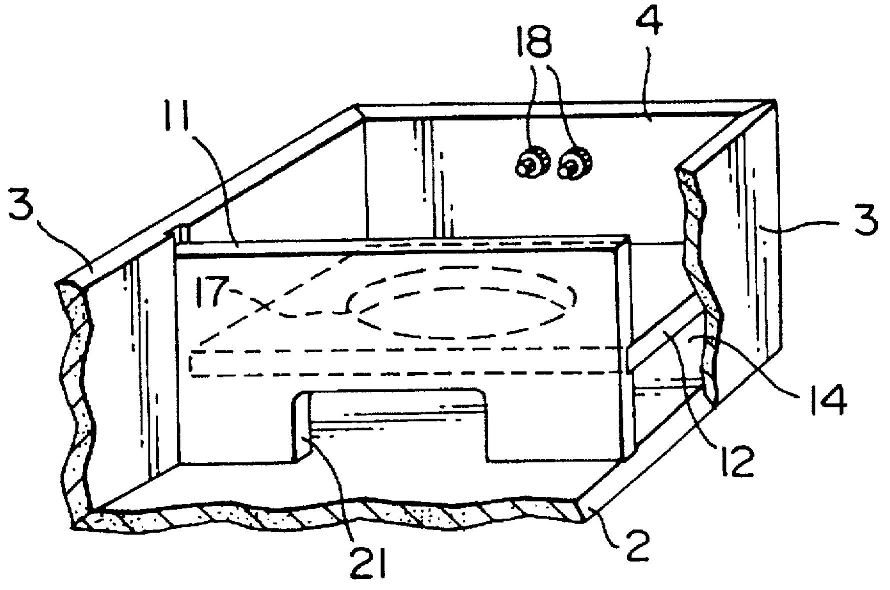
FIG. 5 is a partly sectioned, perspective view of one end of the housing of the speaker assembly of FIGS. 1 to 3.

With reference to FIGS. 4 to 6, the rectangular outlet box 27 is defined by a bottom wall 31, a top wall 32, side walls 33, and end walls 34 and 35. A sound outlet tube 36 extends through the end wall 34, the center of the box 27, the end wall 35 and the end wall 5 of the housing 1. The outlet tube 36 is formed of a hard plastic—in this case ABS plastic. The entire interior of the box 27 surrounding the tube 36 is filled with sand 38 (FIG. 4) and/or epoxy resin to prevent vibration of the tube 36. A suitable epoxy resin is sold by Sika Canada Ltd, Pointe Claire, Quebec under the trade mark Sikadur 32 Hi-Mod.

During production of the speaker assembly, the bottom of outlet box 27, and the outlet tube 36 are assembled. The bottom of the housing 1 and the cover 6 are assembled separately, and the speaker 16, the jacks 18 and the batt 20 are placed in the chamber 13. Before attaching the top wall 32 to the remainder of the outlet box 27, the box is filled with sand and/or epoxy resin, or another solid material. The box 27 is then sealed and mounted in the bottom of the housing 1 with the outlet end of the tube 36 extending through an opening 39 (FIGS. 1 and 3) in the end wall 5 of the housing 1. The spacers 28 are mounted in the housing 1 on each side of the inner end of the box 27, the area on each side of the box 27 is filled with sand, and the cover 25 is mounted on the partition 11, the box 27 and the spacers 28. Finally, the preassembled cover 6 is mounted on the bottom of the housing 1 to complete the speaker assembly.

The preferred material used in the construction of the housing 1 (including the cover 6) is a medium to high density particle board of the type composed of compressed sawdust and resin. While particle board is heavy, the material is inexpensive and relatively easy to assemble. While sand is the preferred filler for the outlet box 27 and the area on each side thereof, any other easily compacted dense, preferably granular material can be used. Upon completion of the assembly, the exterior of the housing 1 is spray painted or otherwise sealed to resemble wood or to achieve other effects. The coating of the exterior of the housing further prevents the escape of sound from the housing except via the outlet tube.

In operation, sound emanating from the speaker 16 passes through the opening 17 in the partition 12 into the intermediate chamber 14, and thence through the opening 21 in the partition 11 into the outlet chamber 2. The sound then travels through the outlet tube 36, exiting the speaker assembly at the end wall 5. The sand and/or epoxy resin in the areas on each side of the outlet box 27 prevent vibration of the box; and the sand in the box 27 prevents vibration of the tube 36. The result is extremely clear sound reproduction.

Figure 7:
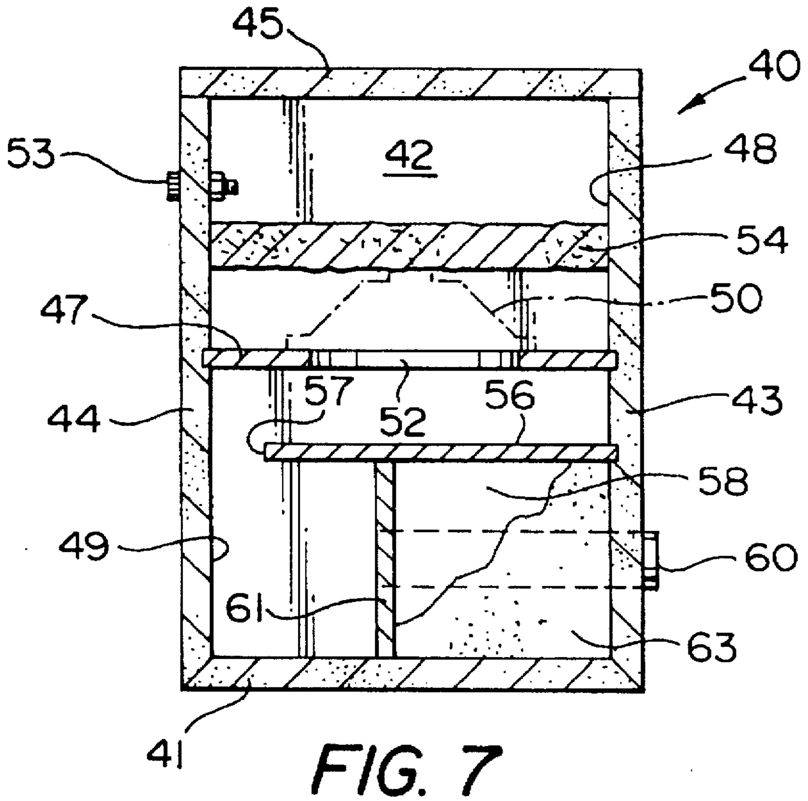
Figure 8:
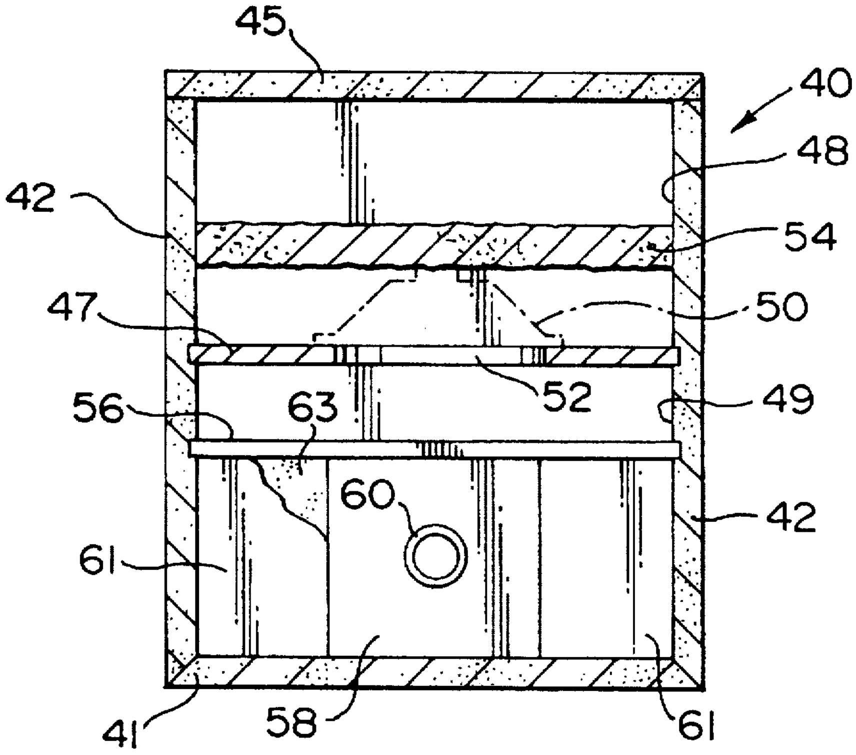

Referring to FIGS. 7 and 8, a second embodiment of the invention includes a housing generally indicated at 40 defined by a bottom wall 41, side walls 42, front and rear end walls 43 and 44, and a top wall or cover 45.

A horizontal partition 47 extends across the housing 40 between the side walls 42 and between the end walls 43 and 44, dividing the interior of the casing into an upper speaker chamber 48 and a lower sound outlet chamber 49. A speaker 50 is mounted on the partition 47 over a circular opening 52 in the partition for admitting sound into the outlet chamber 49. Power is fed to the speaker 50 via jacks 53 (one shown) mounted in the rear wall 44 of the housing 40. A polyester batt 54 covers the top end of the speaker 50 to prevent echo.

A second partition 56, which is spaced apart from the partition 47, extends between the side walls 42 and from the front wall 43 towards the rear wall 44. The partition 56 stops short of the rear wall 44, leaving a gap 57 through which sound can travel to a sound outlet box 58. The box 58, which is similar to the box 27, is mounted in the bottom center of the housing 40 abutting the front wall 43. The box 58 contains a sound outlet tube 60, which extends through the box and through the front wall 43 of the housing 40. Sand and/or epoxy (not shown) fills the remainder of the interior of the box 58. Vertical partitions or spacers 61 (FIG. 8) are provided on each side of the inner end of the box 58, and the area between the sides of the box 58 and the side walls 42 are filled with sand 63 or another solid material.

The spacers 61 can be mounted either at the inner end of the box 58 remote from the front wall 43 of the housing 40 or located between the ends of the box 58, i.e. closer to the front wall 43. In other words, it is not essential that the sand or other solid material fill the entire area on each side of the box 58. However, it is preferable that the sand borders most or all of the area beside each side of the box 58.

It will be appreciated that in its simplest form the speaker assembly includes a housing containing a partition dividing the interior thereof into a speaker chamber for receiving a speaker, and a sound outlet chamber containing an outlet box of the type described hereinbefore, the box being firmly anchored in the outlet chamber.

Thus, there has been described a structurally simple, high fidelity speaker assembly, which is relatively easy to assemble and inexpensive to produce, and which reproduces undistorted sound, particularly in the lower acoustic frequencies.

I claim:

1. A speaker assembly comprising a housing having an interior; at least one partition dividing the interior of said housing into a speaker chamber for receiving a speaker, and a sound outlet chamber; a sound outlet box in said outlet chamber; a sound outlet tube in said outlet box; a solid material in said outlet box surrounding said outlet tube for preventing vibration of said tube during the passage of sound therethrough.

2. The speaker assembly of claim 1, including solid material in said outlet chamber surrounding at least a portion of said outlet box for further preventing vibration of said outlet tube during passage of sound therethrough.

3. The speaker assembly of claim 2, including a sound absorbing cover in said speaker chamber for covering a speaker.

4. The speaker assembly of claim 2, including a first partition extending longitudinally of said housing; a second partition extending transversely of said housing abutting one end of said first partition, said first and second partitions dividing the interior of the housing into the speaker chamber, an intermediate chamber and the outlet chamber; said second partition permitting the passage of sound from a speaker in said speaker chamber into said outlet chamber.

5. The speaker assembly of claim 2, including spacers at an inner end of said outlet box and in spaced apart relationship to said second partition, said spacers locating said outlet box centrally of said outlet chamber; and solid material retained by said spacers on each side of said outlet box for preventing vibration of said outlet box and said outlet tube.

6. The speaker assembly of claim 2, wherein said solid material is an easily compacted, granular material.

7. The speaker assembly of claim 6, wherein said solid material in the outlet box is selected from the group consisting of sand and a mixture of sand and epoxy resin.

8. The speaker assembly of claim 7, wherein said solid material on each side of said outlet box is sand.

9. The speaker assembly of claim 2, wherein said outlet box includes a top wall, side walls and end walls; said tube extending through said end walls and through said granular material, said granular material filling all of the space in said outlet box not occupied by said outlet tube.

10. The speaker assembly of claim 1, wherein said housing is formed of a dense non-metallic material.

11. The speaker assembly of claim 10, wherein said housing is formed of medium to high density particle board.

12. The speaker assembly of claim 2, including a first partition dividing the interior of the housing into the speaker chamber and the sound outlet chamber; a second partition in said outlet chamber on said outlet box; and a gap at one end of said second partition permitting the passage of sound to said outlet box.

13. The speaker assembly of claim 12, wherein said first and second partitions extend transversely of said housing.

* * * * *